United States Patent [19]

Parham

[11] 3,737,792

[45] June 5, 1973

[54] PHASE LOCKED FREQUENCY MODULATION DEMODULATOR CIRCUIT INCLUDING COLPITTS TRANSISTOR AND FEEDBACK TRANSISTOR

[75] Inventor: O. D. Parham, Downey, Calif.

[73] Assignee: Hughes Aircraft Company, Culver City, Calif.

[22] Filed: Feb. 16, 1971

[21] Appl. No.: 119,408

Related U.S. Application Data

[62] Division of Ser. No. 855,007, Sept. 3, 1969, Pat. No. 3,611,195.

[52] U.S. Cl. ..................329/103, 307/233, 329/122, 331/23

[51] Int. Cl. ..................H03d 3/24

[58] Field of Search ..................329/103, 122; 332/16 T; 307/233; 331/115, 117, 23, 18, 25; 325/346, 419

[56] References Cited

UNITED STATES PATENTS

| | | | |
|---|---|---|---|
| 2,770,731 | 11/1956 | Bopp et al. | 331/115 |
| 2,851,540 | 9/1958 | Theriault | 332/16 T X |
| 2,820,145 | 1/1958 | Wolfendale | 331/115 |
| 3,611,195 | 10/1971 | Parham | 329/122 X |

*Primary Examiner*—Alfred L. Brody
*Attorney*—James K. Haskell

[57] ABSTRACT

A phase locked frequency modulation demodulator circuit is disclosed including a transistor connected in a Colpitts configuration. An effective tank circuit capacitance is varied in accordance with an error signal indicative of the frequency difference between a frequency modulated input signal and a signal at the instantaneous oscillation frequency of the circuit to vary the instantaneous oscillation frequency accordingly, causing the circuit to phase lock onto the carrier frequency of the input signal and to produce an amplitude varying signal indicative of the frequency modulation on the input signal.

11 Claims, 7 Drawing Figures

PHASE LOCKED FREQUENCY MODULATION DEMODULATOR CIRCUIT INCLUDING COLPITTS TRANSISTOR AND FEEDBACK TRANSISTOR

This is a division of application Ser. No. 855,007, filed Sept. 3, 1969.

This invention relates to electronic transistor circuits, and more particularly relates to a novel phase locked frequency modulation demodulator.

It is an object of the present invention to provide a phase locked frequency modulation demodulator circuit which is able to phase lock onto an incoming carrier signal faster than any known phase locked demodulator of the prior art.

It is a further object of the present invention to provide a phase locked demodulator circuit which requires minimum circuitry and which provides improved demodulated signal-to-noise characteristics.

In accordance with the foregoing objects, a phase locked frequency modulation demodulator circuit according to the invention includes a transistor and circuitry for providing an inductance between the base electrode of the transistor and a power supply terminal and for providing a capacitance between the transistor emitter electrode and a power supply terminal. The effective capacitance in parallel with the aforementioned inductance is varied in accordance with an error signal indicative of the frequency difference between a frequency modulated input signal and a signal at the instantaneous oscillation frequency of the circuit to vary the instantaneous oscillation frequency of the circuit accordingly, causing the circuit to phase lock onto the carrier frequency of the input signal, and to produce an amplitude varying signal indicative of the frequency modulation on the input signal.

Additional objects, advantages and characteristic features of the invention will become more fully apparent from the following detailed description of a preferred embodiment of the invention when considered in conjunction with the accompanying drawings in which.

Figures 1, 2, 3:
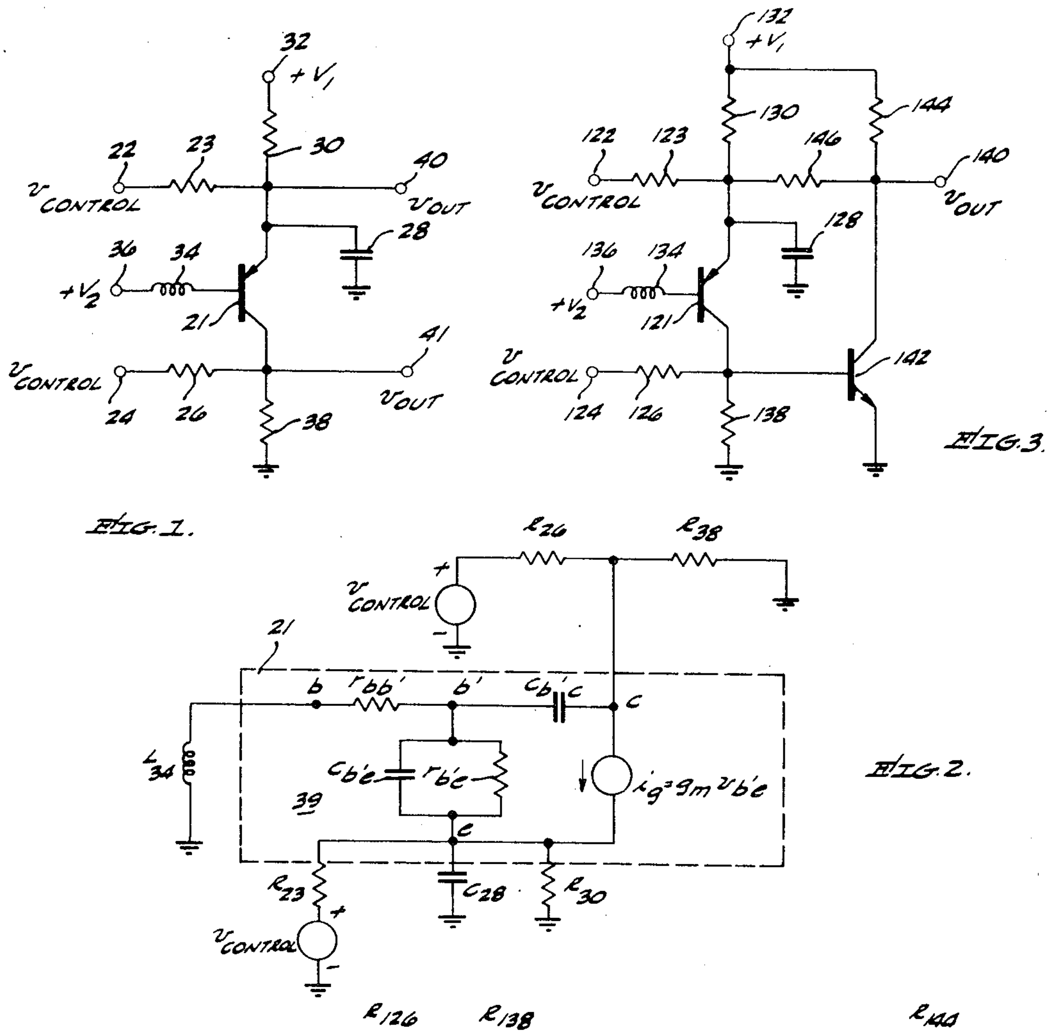
FIG. 1 is a schematic circuit diagram illustrating a basic variable frequency oscillator (and frequency modulator) circuit used in explaining the invention.
FIG. 2 is a schematic ac equivalent circuit diagram representing the behavior of the circuit of FIG. 1.
FIG. 3 is a schematic circuit diagram illustrating a more complex variable frequency oscillator (and frequency modulator) circuit used in explaining the invention.

Referring with greater particularity to FIG. 1, a variable frequency oscillator circuit may be seen to be constructed around a transistor 21 which, although illustrated as a PNP transistor, alternatively may be an NPN transistor in which case power supply voltage polarities would be used which are opposite to that shown in FIG. 1. The transistor 21 is preferably biased for Class A amplification.

A control voltage $v_{control}$ may be applied to the circuit either at a first input terminal 22 which is coupled via current determining resistor 23 to the emitter electrode of transistor 21 or at a second input terminal 24 which is coupled via a resistor 26 to the collector electrode of transistor 21. The emitter electrode of transistor 21 is coupled by means of a capacitor 28 to a level of reference potential illustrated as ground and is also coupled via a load resistor 30 to a power supply terminal 32 furnishing a voltage $+V_1$ which may be +12 volts, for example. An inductor 34 may be coupled between the base electrode of transistor 21 and a terminal 36 furnishing a power supply voltage $+V_2$ which may be +4 volts, for example.

A load resistor 38 is coupled between the collector electrode of transistor 21 and ground. Regardless of whether the control voltage $v_{control}$ is applied to terminal 22 or terminal 24, the output voltage $v_{out}$ may be taken from the circuit at either a first output terminal 40 connected to the emitter electrode of the transistor 21 or a second output terminal 41 connected to the transistor collector electrode.

A preferred application for the circuit of FIG. 1 is as a frequency modulator. In such an application the control voltage $v_{control}$ is an amplitude varying modulating voltage, and the output voltage $v_{out}$ becomes a carrier voltage which is frequency modulated in accordance with the amplitude of the input modulating voltage.

An ac equivalent circuit for the circuit of FIG. 1 is shown in FIG. 2, the equivalent circuit components representing the behavior of the transistor 21 appearing within dashed rectangle 21. The transistor base, emitter and collector electrodes are designated by the letters *b*, *e* and *c*, respec-tively, with the letter *b'* representing an internal point in the base circuit of the transistor. In addition, $r_{bb'}$ represents the base spreading resistance of the transistor, $r_{b'e}$ represents the effective resistance from the internal base point *b'* to the emitter electrode, $C_{b'e}$ represents the effective diffusion capacitance from the internal base point *b'* to the emitter electrode, $C_{b'c}$ represents the junction capacitance between the internal base point *b'* and the collector electrode (and is often referred to as the transistor $C_{ob}$), $i_g$ represents an equivalent generated current equal to $g_m v_{b'e}$ where $g_m$ is the transconductance of the transistor and is directly proportional to the emitter current $i_e$, and $v_{b'e}$ is the voltage appearing between the internal base point *b'* and the emitter electrode. For further details as to this transistor equivalent circuit, reference may be made to *Transistor Circuit Analysis* by Maurice V. Joyce and Kenneth K. Clarke, Addison-Wesley Publishing Company, Inc., Reading, Mass., Chapter 7–4, pages 227–228.

In addition, in the equivalent circuit of FIG. 2, $L_{34}$ represents the inductance of inductor 34; $C_{28}$ represents the capacitance of capacitor 28; and $R_{23}$, $R_{26}$, $R_{30}$ and $R_{38}$ represent the resistance of respective resistors 23, 26, 30 and 38.

The operation of the circuit of FIG. 1 will now be described with reference to the equivalent circuit of FIG. 2. The circuit functions as a Colpitts oscillator having a tank circuit 39 in which the tank circuit inductance is furnished by inductance $L_{34}$ and the tank circuit capacitive branches are provided by respective capacitances $C_{b'e}$ and $C_{28}$. In the absence of a control voltage at either of the circuit input terminals 22 or 24, the circuit oscillates at the natural resonant frequency $f_o$ of the tank circuit 39 to provide an output voltage (at terminal 40 or terminal 41, or both) at the frequency $f_o$, which is the carrier frequency of the output voltage $v_{out}$ when the circuit is used as a frequency modulator.

In order to vary the oscillation frequency of the circuit of FIG. 1, the resonant frequency of the tank circuit 39 is varied by changing the capacitance $C_{b'e}$ in accordance with a control signal. The capacitance $C_{b'e}$ is a function of the density of minority charge carriers in the transistor base region and is also a function of the electrical volume of the base region. Since the minority charge carrier density is a function of the transistor emitter current, the capacitance $C_{b'e}$ may be changed by varying the emitter current. Thus, when an amplitude varying control voltage $v_{control}$ is applied to input terminal 22, the emitter current of the transistor 21 (and hence the resonant frequency of the tank circuit 39) is changed in proportion to the amplitude variations of the control voltage, producing a corresponding change in the frequency of the output voltage $v_{out}$ at terminals 40 and 41.

Since a change in emitter current results in an essentially immediate change in the capacitance $C_{b'e}$ an essentially instantaneous change in the circuit oscillation frequency can be achieved with the circuit of FIG. 1 when the control voltage is applied to terminal 22. In typical prior art frequency modulator circuits, the oscillation frequency is changed by varying a varactor diode capacitance in accordance with an applied control voltage. However, since the rate at which voltage driven variable capacitances are able to change is limited, the frequency of oscillation of such prior art circuits cannot be changed instantaneously. On the other hand, since the circuit of FIG. 1 (input at terminal 22) utilizes a current driven variable capacitance, the oscillation frequency theoretically can be changed instantaneously; in practice the rate of change of the oscillation frequency of such a circuit is orders of magnitude greater than that of prior art circuits. In fact, the rate of change of the oscillation frequency of this circuit appears to be limited by only the frequency response of transistor 21.

As has been mentioned above, the capacitance $C_{b'e}$ is also a function of the electrical volume of the transistor base region. This electrical volume is a function of the spreading of the depletion region at the collector-base junction, which in turn is dependent upon the collector-base voltage. Thus, the capacitance $C_{b'e}$ may also be changed by varying the voltage applied to the collector of the transistor 21. Accordingly, when the amplitude varying control voltage $v_{control}$ is applied to input terminal 24, the voltage at the collector of the transistor 21 is varied accordingly to produce a corresponding change in the circuit oscillation frequency.

When a modulating voltage is applied to terminal 24, the circuit of FIG. 1 does not provide as rapid a rate of change of oscillation frequency as when a modulating voltage is applied to terminal 22 because a voltage drive is employed rather than a current drive. However, although the capacitance $C_{b'e}$ is being varied, the driving voltage is applied to capacitance $C_{b'c}$. Since, typically, capacitance $C_{b'c}$ is around 10 $\mu\mu$f while capacitance $C_{b'e}$ is essentially 500–1,000 $\mu\mu$f, capacitance $C_{b'e}$ is being changed by applying a voltage to another capacitance around 50 to 100 times smaller. Hence, the rate of change of the oscillation frequency of the circuit of FIG. 1 having a modulating voltage applied to a terminal 24, although not as fast as when the modulating voltage is applied to terminal 22, is nevertheless 50 to 100 times faster than frequency modulator circuits of the prior art. In addition, since a greater percentage of capacitance change can be achieved in the capacitive branch of the tank circuit with the circuit of FIG. 1 (regardless of where the modulating voltage is applied) than with prior art Colpitts frequency modulator circuits, the circuit of FIG. 1 is operable over a wider frequency range of modulating voltages than such prior art circuits.

FIG. 3 illustrates a further variable frequency oscillator circuit. The circuit of FIG. 3 is similar to that of FIG. 1, and hence corresponding components in the circuit of FIG. 3 are designated by the same second and third reference numeral digits as their counterpart components in the circuit of FIG. 1, the FIG. 3 components being further designated by the prefix numeral "1."

The circuit of FIG. 3 differs from that of FIG. 1 in that a feedback path including a second transistor 142 is provided for the transistor 121. The transistor 142 is preferably of a conductivity type complementary to that of the transistor 121; hence, in the illustrated circuit, since the transistor 121 is shown as a PNP transistor, the transistor 142 is illustrated as of the NPN variety. The transistor 142 has its base electrode connected to the collector electrode of transistor 121 and has its emitter electrode coupled to ground. The collector electrode of transistor 142 is coupled via a load resistor 144 to power supply terminal 132. A feedback impedance, illustrated as a resistor 146, is coupled between the collector electrode of transistor 142 and the emitter electrode of transistor 121. The output voltage $v_{out}$ may be taken from the circuit at either the collector electrode or the emitter electrode of transistor 121 or the collector electrode of transistor 142. However, since it is preferred to obtain the circuit output from the collector electrode of transistor 142, output terminal 140 is shown as connected to this electrode.

Figure 4:
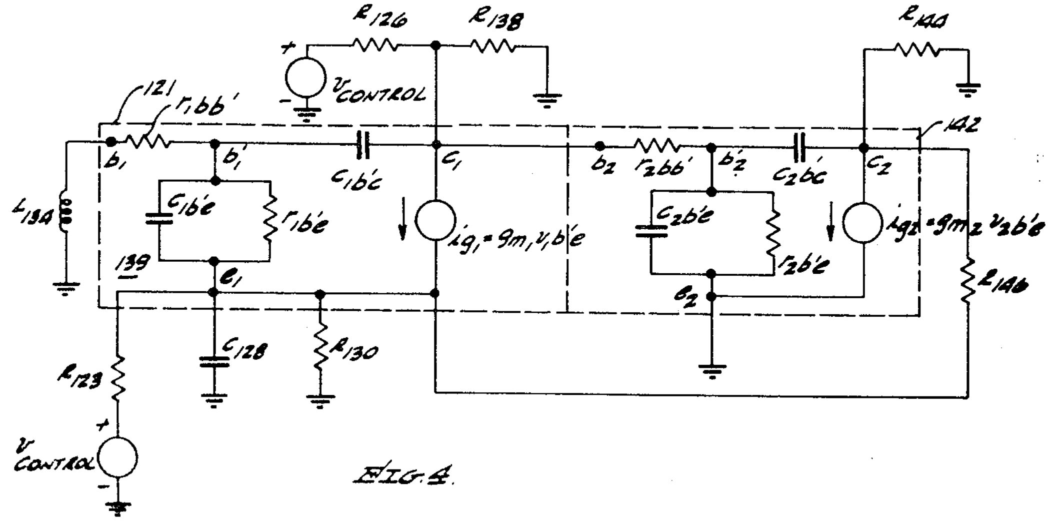
FIG. 4 is a schematic ac equivalent circuit diagram depicting the behavior of the circuit of FIG. 3.

An ac equivalent circuit for the circuit of FIG. 3 is shown in FIG. 4. The nomenclature used in FIG. 4 corresponds to the components of the circuit of FIG. 3 in the same way that the nomenclature of FIG. 2 corresponds to the components of the circuit of FIG. 1, as described above. Moreover, equivalent circuit components representing the behavior of transistor 121 appear within dashed rectangle 121 and are designated by the subscript "1," while equivalent circuit components representing the behavior of transistor 142 appear within dashed rectangle 142 and are designated by the subscript "2." In addition, in FIG. 4 $R_{144}$ and $R_{146}$ represent the resistance of respective resistors 144 and 146.

Figure 5:
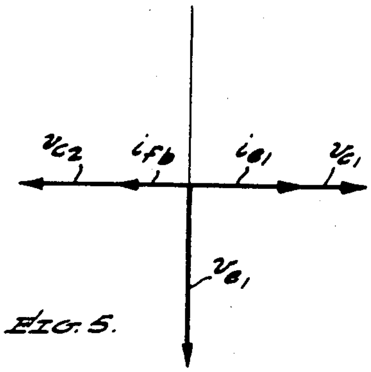
FIG. 5 is a vector diagram illustrating the currents and voltages at various points in the circuit of FIG. 3 and used in explaining the operation of the circuit of FIG. 3.
Figure 6:
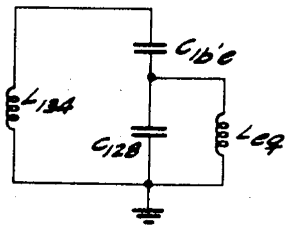
FIG. 6 is a simplified equivalent circuit diagram depicting the behavior of a portion of the circuit of FIG. 3 and further used in explaining the operation of the circuit of FIG. 3.

The operation of the circuit of FIG. 3 will now be described with reference to the equivalent circuit of FIG. 4 and the vector diagram of FIG. 5 illustrating currents and voltages at various points in the circuit of FIG. 3 as measured with respect to ground. The current $i_{e_1}$ at the emitter electrode of transistor 121 is in phase with the collector current of transistor 121, and hence is also in phase with the voltage $v_{o_1}$ at the collector electrode of transistor 121. However, the emitter current $i_{e_1}$ leads the voltage $v_{e_1}$ at the emitter electrode of transistor 121 by 90° due to the presence of capacitance $C_{128}$. The collector voltage $v_{o_1}$ of transistor 121 is applied to the base electrode of transistor 142 and, on account of a phase reversal in the transistor 142, the resultant voltage $v_{o_2}$ at the collector electrode of transistor 142 is 180° out of phase with the voltage $v_{o_1}$. The resultant current which flows through resistance $R_{146}$, which is the feedback current $i_{fb}$ applied to the emitter electrode of transistor 121, is in phase with the voltage $v_{o_2}$. As may be seen from FIG. 5, the current $i_{fb}$ lags the voltage $v_{e_1}$ at the emitter electrode of transistor 121 by 90°, and hence an effective equivalent inductance is presented between the emitter electrode of transistor 121 and ground. A simplified equivalent circuit depicting the aforedescribed circuit behavior is shown in FIG. 6 wherein the effective inductance is designated as $L_{eq}$.

The equivalent inductance $L_{eq}$ and the capacitance $C_{1b'e}$ form a series resonant circuit having a resonant frequency slightly higher than the tank circuit resonant frequency $f_o$ and provide an effective capacitance smaller than that which would be provided in the absence of inductance $L_{eq}$. By varying the effective inductance $L_{eq}$, the effective capacitance in parallel with inductance $L_{134}$ may be varied, and the frequency of oscillation of the circuit will be changed accordingly.

The equivalent inductance $L_{eq}$ is inversely proportional to the equivalent generated current $i_{g_2}$ for the transistor 142, and which current is equal to the product of the transconductance $g_{m_2}$ for the transistor 142 and the transistor voltage $v_{2b'e}$. Since the transconductance $g_m$ of a transistor is directly proportional to the transistor emitter current, the transconductance $g_m$ 9 of the transistor 142 (and hence the inductance $L_{eq}$) may be changed by varying the emitter current $i_{e_2}$ of the transistor 142.

In order to illustrate the foregoing with respect to operation of the circuit of FIG. 3, assume that the control voltage $v_{control}$ applied to terminal 124 is sufficiently negative to bias the transistor 142 to a cutoff condition. In such a condition the emitter current $i_{e_2}$ of transistor 142 is zero, producing an equivalent inductance $L_{eq}$ of a maximum value (theoretically approaching infinity). The effective capacitance in parallel with inductance 134 is of a minimum value, and the circuit oscillates at its highest frequency of oscillation. In this condition (transistor 142 cut off) the circuit of FIG. 3 operates as the Colpitts oscillator of FIG. 1.

When the control voltage $v_{control}$ applied to input terminal 124 is increased in a positive direction, the emitter current $i_{e_2}$ and the transconductance $g_{m_2}$ of the transistor 142 increase. The equivalent inductance $L_{eq}$ is thus decreased, thereby increasing the effective capacitance in parallel with inductance $L_{134}$ and lowering the oscillation frequency of the circuit in proportion to the increase in the input voltage. Hence, by applying an amplitude varying modulating voltage to input terminal 124, the instantaneous oscillation frequency of the circuit can be varied accordingly to produce a corresponding frequency modulated signal.

Since the equivalent inductance $L_{eq}$ changes as fast as the transconductance $g_{m_2}$ of transistor 142 can be changed, the oscillation frequency of the circuit of FIG. 3 theoretically can be changed instantaneously. In practice, however, the rate of change of this oscillation frequency appears to be limited by only the upper cutoff frequency of the transistor 142.

Moreover, since the transconductance $g_{m_2}$ of the transistor 142 can be varied over a large percentage range, large variations in the oscillation frequency of the circuit of FIG. 3 can be achieved. In fact, the circuit has oscillated at frequencies as low as one-half of its maximum (Colpitts) oscillation frequency. When the circuit is used as a frequency modulator, by biasing the transistor 142 such that the center frequency is midway between the aforementioned maximum and low oscillation frequencies, a frequency deviation range as great as 33 percent above and below the center frequency can be realized. Thus, the circuit of FIG. 3 is operable over a considerably wider frequency range of modulating voltages than with comparable prior art circuits, and is even operable over a wider frequency range of modulating voltages than the circuit of FIG. 1. In addition, with the circuit of FIG. 3, undesired amplitude variations in the output waveform are minimized due to the degenerative feedback provided by the transistor 142 and because the amplitude of the oscillating voltage at the collector electrode of transistor 121 is independent of the biasing of transistor 121.

Figure 7:
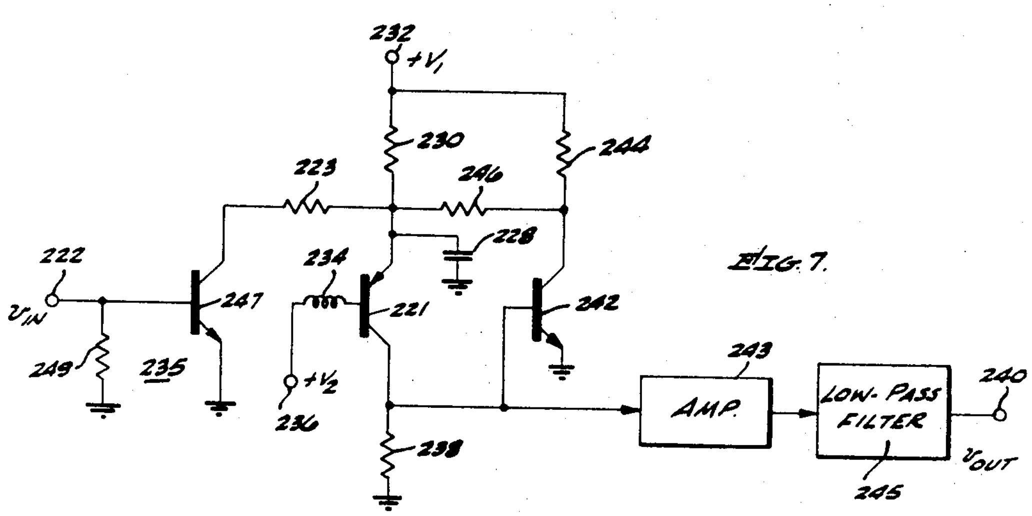
FIG. 7 is a schematic circuit diagram showing a phase locked frequency modulation demodulator circuit in accordance with the invention.

A phase locked frequency modulation demodulator circuit according to the present invention, is illustrated in FIG. 7. The circuit of FIG. 7 is similar to the circuit of FIG. 3, and hence corresponding components in the circuit of FIG. 7 are designated by the same second and third reference numeral digits as their counterpart components in the circuit of FIG. 1, but bear a first reference numeral digit "2" instead of "1." The circuit of FIG. 7 differs from the circuit of FIG. 3, first, in that high impedance input circuitry 235 is coupled between input terminal 222 and the emitter electrode of transistor 221 and, second, in that an amplifier 243 and a low-pass filter 245 are coupled between the collector electrode of transistor 221 and output terminal 240.

As shown in FIG. 7, exemplary circuitry which may be used for the high impedance input circuitry 235 includes an NPN transistor 247 having its base electrode connected to input terminal 222, its emitter electrode connected to ground, and its collector electrode connected to resistor 223. A bias resistor 249 is connected between the base electrode of transistor 247 and ground. Amplifier 243, which may be a common emitter or a common base transistor amplifier, for example, decouples reactance components of low-pass filter 245 from the oscillator circuitry to prevent interference with phase locking of the oscillator circuitry onto the input signal frequency. Low-pass filter 245 prevents the carrier frequency from reaching output terminal 240 so that a demodulated video output signal is provided at terminal 240.

In the operation of the demodulator circuit of FIG. 7, transistor 242 is biased to an intermediate conductive level so that (in the same manner as set forth above with respect to the circuit of FIG. 3) the oscillator portion of the circuit of FIG. 7 will oscillate at a frequency $f_l$ intermediate its maximum and minimum oscillation frequencies. When an input voltage $v_{in}$ at a frequency $f_{in}$ within the range of frequencies at which the circuit will oscillate is applied to input terminal 222, the base-emitter diode of transistor 221 functions as a phase detector and compares the frequency $f_{in}$ with the frequency $f_l$ at which the circuit is oscillating. An error signal indicative of the frequency difference between the frequencies $f_{in}$ and $f_l$ is produced at the collector electrode of transistor 221. This error signal is applied to the base electrode of transistor 242 to adjust the emitter current $i_{e_2}$ of transistor 242 so as to cause the circuit to phase lock onto the input frequency $f_{in}$. When the input voltage $v_{in}$ carries frequency modulation, the error signal at the collector electrode of transistor 221 contains a corresponding demodulated signal. After removal of the carrier frequency in the low-pass filter 245, this error signal forms the demodulated output signal $v_{out}$ from the circuit.

As has been explained above with respect to the circuit of FIG. 3, the oscillation frequency of the oscillator portion of the circuit of FIG. 7 can be changed at a very high rate. Thus, the rate at which a phase locked demodulator according to FIG. 7 is able to lock onto an incoming carrier signal is extremely fast, and in fact is faster than any known phase locked demodulator according to the prior art. Moreover, the oscillator portion of the demodulator of FIG. 7 functions as an entire phase locked loop, whereas in prior art phase locked demodulators a separate oscillator and phase detector were required. Thus, a phase locked demodulator according to the present invention not only eliminates circuit components but also reduces time delays due to the travel of signals between the various circuit portions. In addition, a phase locked demodulator according to the invention provides a demodulated signal-to-noise ratio which at low carrier signal-to-noise ratios is substantially greater than that of prior art phase locked demodulators. This improvement is realized because when a demodulator circuit according to the invention locks onto an incoming noise frequency, due to its fast locking capability it can return to the signal frequency before the next noise spike is received.

It should be apparent from the foregoing that although the invention has been shown and described with reference to particular circuits, various changes and modifications obvious to a person skilled in the art are deemed to lie within the purview of the invention.

What is claimed is:

1. A phase locked frequency modulation demodulator circuit comprising: a transistor having an emitter electrode, a collector electrode, and a base electrode; first, second, and third terminals to which circuit operating potentials are applied, said first terminal being coupled to said emitter electrode, said third terminal being coupled to said collector electrode; means for providing an inductance between said base electrode and said second terminal and for providing a capacitance between said emitter electrode and said third terminal, whereby circuit oscillation may be achieved; means for applying a frequency modulated carrier signal to said emitter electrode; feedback means coupled between said collector and emitter electrodes for providing an effective inductance in parallel with said capacitance and for varying said effective inductance in accordance with an error signal indicative of the frequency difference between said frequency modulated signal and a signal at the instantaneous oscillation frequency of the circuit to vary the instantaneous oscillation frequency of the circuit accordingly, said error signal containing an amplitude varying component indicative of the modulation on said frequency modulated carrier signal; and means coupled to said collector electrode for removing the carrier frequency component from said error signal.

2. A phase locked frequency modulation demodulator circuit according to claim 1 wherein the last named means includes means coupled to said collector electrode for amplifying said error signal and a low-pass filter coupled to said amplifying means.

3. A phase locked frequency modulation demodulator circuit comprising: a first transistor having an emitter electrode, a collector electrode, and a base electrode; first, second, third terminals to which circuit operating potentials are applied, said first terminal being coupled to said emitter electrode, said third terminal being coupled to said collector electrode; means for providing an inductance between said base electrode and said second terminal and for providing a capacitance between said emitter electrode and said third terminal, whereby circuit oscillation may be achieved; means for applying a frequency modulated carrier signal to said emitter electrode; means including a second transistor for varying the effective capacitance in parallel with said inductance in accordance with an error signal indicative of the frequency difference between said frequency modulated signal and a signal at the instantaneous oscillation frequency of the circuit to vary the instantaneous oscillation frequency of the circuit accordingly, said error signal containing an amplitude varying component indicative of the modulation on said frequency modulated carrier signal; means coupled to the collector electrode of said first transistor for removing the carrier frequency component from said error signal; said second transistor having a base electrode coupled to the collector electrode of said first transistor and having respective emitter and collector electrodes coupled to said third and first terminals, respectively; and said means including said second transistor further including a feedback impedance coupled between the collector electrode of said second transistor and the emitter electrode of said first transistor.

4. A phase locked frequency modulation demodulator circuit according to claim 3 wherein said means including said second transistor further includes means coupled to the collector electrode of said first transistor for amplifying said error signal and a low-pass filter coupled to said amplifying means.

5. A phase locked frequency modulation demodulator circuit according to claim 3 wherein said frequency modulated carrier signal applying means includes a third transistor having a base electrode adapted to receive a frequency modulated input signal, a collector electrode resistively coupled to the emitter electrode of said first transistor, and an emitter electrode coupled to said third terminal.

6. A phase locked frequency modulation demodulator circuit according to claim 1 wherein said feedback means includes a second transistor having a base electrode coupled to said collector electrode, a collector electrode coupled to said emitter electrode and to said first terminal, and an emitter electrode coupled to said third terminal.

7. A phase locked frequency modulation demodulator circuit according to claim 3 wherein said second transistor is of a conductivity type complementary to that of said first transistor.

8. A phase locked frequency modulation demodulator circuit according to claim 3 wherein a first load impedance is coupled between said first terminal and the emitter electrode of said first transistor, a second load impedance is coupled between said first terminal and the collector electrode of said second transistor, and a third load impedance is coupled between said third terminal and the collector electrode of said first transistor.

9. A phase locked frequency modulation demodulator circuit comprising: a transistor having an emitter electrode, a collector electrode, and a base electrode; first, second, and third terminals to which circuit operating potentials are applied, said first terminal being coupled to said emitter electrode, said third terminal being coupled to said collector electrode; means for providing an inductance between said base electrode and said second terminal and for providing a capacitance between said emitter electrode and said third terminal, whereby circuit oscillation may be achieved; means for applying a frequency modulated carrier signal to the emitter-collector path of said transistor; feedback means coupled between said collector and emitter electrodes for providing an effective inductance in parallel with said capacitance and for varying said effective inductance in accordance with an error signal indicative of the frequency difference between said frequency modulated signal and a signal at the instantaneous oscillation frequency of the circuit to vary the instantaneous oscillation frequency of the circuit accordingly, said error signal containing an amplitude varying component indicative of the modulation on said frequency modulated carrier signal; and means coupled to said collector electrode for removing the carrier frequency component from said error signal.

10. A phase locked frequency modulation demodulator circuit according to claim 9 wherein said feedback means includes a second transistor having a base electrode coupled to said collector electrode, a collector electrode coupled to said emitter electrode and to said first terminal, and an emitter electrode coupled to said third terminal.

11. A phase locked frequency modulation demodulator circuit according to claim 10 wherein a first load impedance is coupled between said first terminal and the emitter electrode of said first transistor, a second load impedance is coupled between said first terminal and the collector electrode of said second transistor, and a third load impedance is coupled between said third terminal and the collector electrode of said first transistor.

* * * * *